United States Patent
Chen et al.

(10) Patent No.: US 9,048,151 B2
(45) Date of Patent: Jun. 2, 2015

(54) SELF-POWERED INTEGRATED CIRCUIT WITH PHOTOVOLTAIC CELL

(75) Inventors: Yuanning Chen, Plano, TX (US); Nagarajan Sridhar, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/218,340

(22) Filed: Aug. 25, 2011

(65) Prior Publication Data
US 2012/0126298 A1    May 24, 2012

Related U.S. Application Data

(60) Provisional application No. 61/377,063, filed on Aug. 25, 2010.

(51) Int. Cl.
*H01L 21/00* (2006.01)
*H01L 27/142* (2014.01)
*H01L 27/06* (2006.01)
*H01L 31/0224* (2006.01)

(52) U.S. Cl.
CPC .......... *H01L 27/142* (2013.01); *H01L 27/0688* (2013.01); *H01L 31/022425* (2013.01); *Y02E 10/50* (2013.01)

(58) Field of Classification Search
USPC ................... 438/153, 279, 275; 257/E31.113
See application file for complete search history.

(56) References Cited

U.S. PATENT DOCUMENTS

| | | | |
|---|---|---|---|
| 5,485,027 A * | 1/1996 | Williams et al. | 257/343 |
| 2009/0155957 A1* | 6/2009 | Chen et al. | 438/109 |
| 2009/0206420 A1* | 8/2009 | Stecher et al. | 257/390 |
| 2010/0171197 A1* | 7/2010 | Chang et al. | 257/621 |
| 2011/0318874 A1* | 12/2011 | Yamazaki | 438/98 |
| 2012/0103402 A1* | 5/2012 | Kline | 136/252 |

* cited by examiner

*Primary Examiner* — Julia Slutsker
(74) *Attorney, Agent, or Firm* — Jacqueline J. Garner; Frank D. Cimino

(57) ABSTRACT

A photovoltaic cell is provided as a composite unit together with elements of an integrated circuit on a common substrate. In a described embodiment, connections are established between a photovoltaic cell portion and a circuitry portion of an integrated structure to enable self-powering of the circuitry portion by the photovoltaic cell portion.

12 Claims, 5 Drawing Sheets

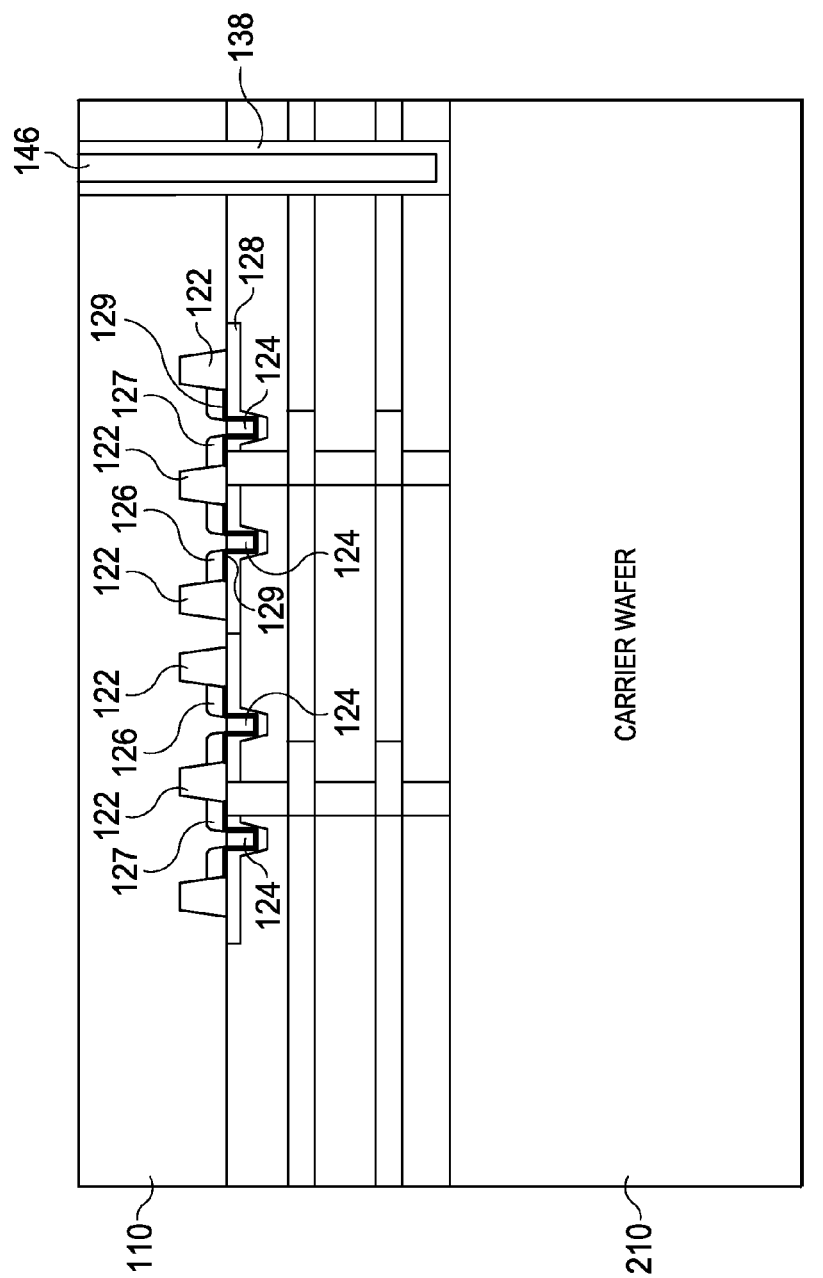

SELF-POWERED INTEGRATED CIRCUIT WITH PHOTOVOLTAIC CELL

This application claims the benefit of U.S. Provisional Application No. 61/377,063, filed Aug. 25, 2010, the entirety of which is incorporated herein by reference.

This relates to integrated circuits and methods for their fabrication. This also relates to photovoltaic (solar) cells.

BACKGROUND

There is a growing interest in new and better ways to economically and efficiently harvest ambient energy to power electronic devices using photovoltaic, piezoelectric, electrodynamic, thermoelectric and other power generating technologies as replacements for or in augmentation of batteries and other conventional power sources.

There is also a growing interest in the development of sensing elements for wide deployment of sensing elements at scattered locations, such as in industrial wireless sensor networks (WSNs) and the like, for remotely determining the status of environmental and other local conditions (temperature, pressure, flow rate, fill level, chemical presence, biological conditions, etc.), under circumstances requiring dependable portable power sources but where batteries or battery power alone may not be adequate.

SUMMARY

A photovoltaic cell is provided as a composite unit together with elements of an integrated circuit on a common substrate. In a described embodiment, connections are established between a photovoltaic cell portion and a circuitry portion of an integrated structure to enable self-powering of the circuitry portion by the photovoltaic cell portion.

BRIEF DESCRIPTION OF THE DRAWINGS

Example embodiments are described with reference to accompanying drawings, wherein:

FIGS. 2A-2C are simplified cross-sectional views of the integrated circuit device fabricated using a carrier wafer and bonding.

DETAILED DESCRIPTION OF EXAMPLE EMBODIMENTS

Figure 1:
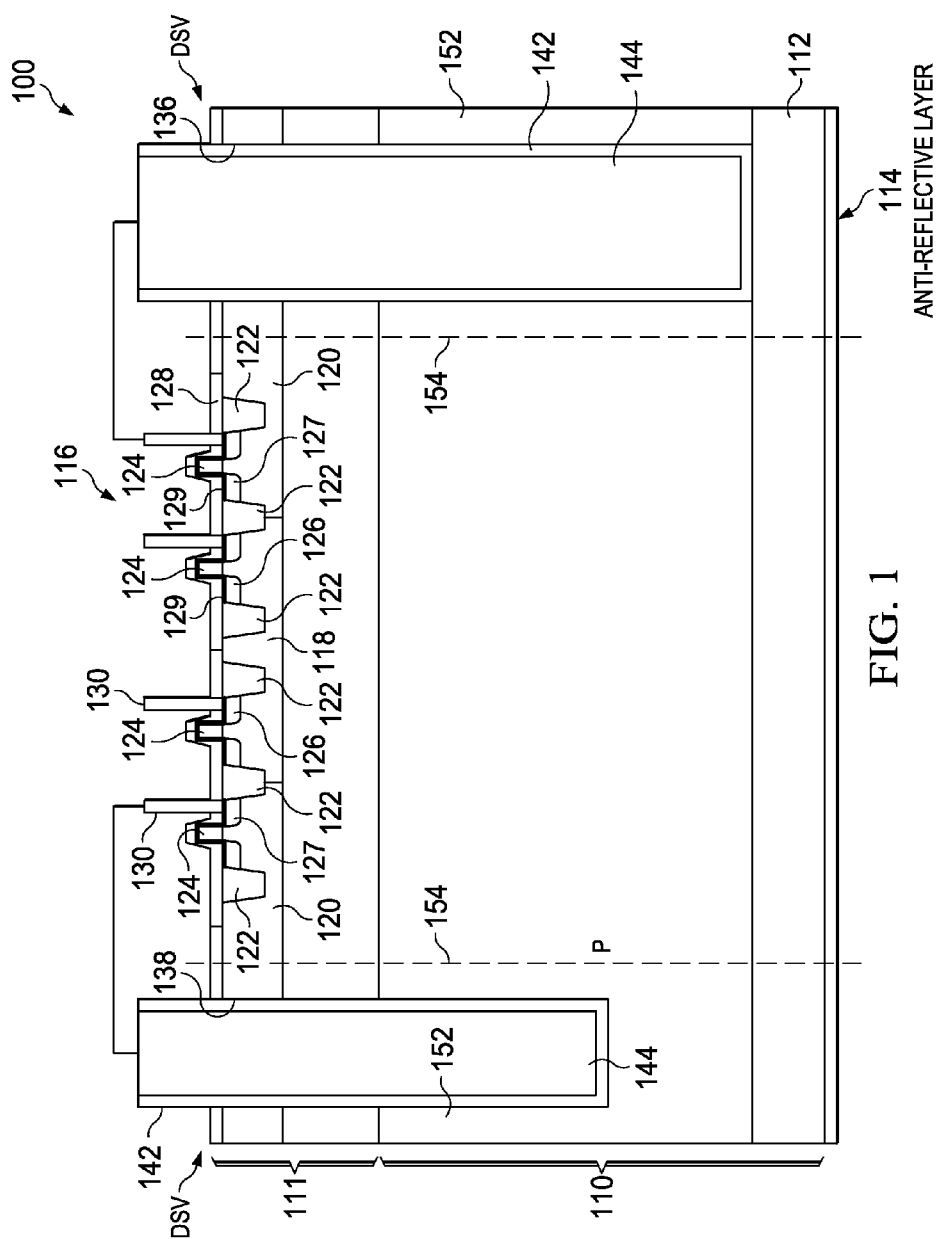
FIG. 1 is a simplified cross-sectional view of an integrated circuit device fabricated in accordance with principles of the invention.

Example implementations of the invention are described with reference to the structure and fabrication of an integrated circuit device 100 illustrated in FIG. 1.

The device 100 comprises a substrate 110 in the form of a semiconductor wafer, which may, e.g., be a standard 200 mm or 300 mm silicon wafer having a thickness of about 675 microns and a p-type bulk conductivity. An epitaxial layer 111 of semiconductor material of, e.g., 3 micron thickness of silicon is formed on a front surface of the wafer. A back side of the wafer is counterdoped with n-type dopant to form a heavily doped (viz., n+) n-type region 112 of, e.g., about 1 to 2 micron thickness to define a pn junction of a photovoltaic cell with the remainder of the p-type bulk. The implantation is activated using, e.g., a thermal anneal process, such as a furnace anneal for about 1 hour, rapid thermal anneal (RTP) for about 2 to 3 minutes, or laser anneal for about 10 seconds at 1000° C. to 1200° C., or any other suitable activation procedure. The n-type region 112 is then covered with one or more protective layers (viz., nitrides, oxides, etc.), preferably including at least one anti-reflective layer 114. In addition to, or instead of an anti-reflective coating, other mechanisms (e.g., grooving, roughening, etc.) may be employed to reduce reflection of incident illumination onto the n-doped region 112.

PMOS and/or NMOS transistors and/or other circuit devices 116 are formed in or on the epitaxial layer 111 using, e.g., typical advanced CMOS integrated circuit fabrication processes. Because formation of the photovoltaic cell junction will characteristically involve a larger thermal budget than formation of the devices 116 during fabrication, formation of devices 116 is preferably deferred until after activation of the n-type region 112 and deposition of the anti-reflective coating 114. Typical fabrication steps employed in the formation of transistor devices may include doping of the epitaxial layer 111 to provide n-type and/or p-type wells 118, 120 separated by isolation regions 122 in a top surface thereof, formation of gate electrode/dielectric stack structures 124, further doping to provide p-type and/or n-type source/drain and/or other implantations 126, 127 into the wells 118, 120 proximate the gate stacks 124, gate and source/drain silicidations or other contact formations 129, and formation of one or more pre-metal, intrametal and/or interlevel dielectric layers 128 over the gate structures and source/drains together with the definition of metal interconnects (viz., etching and filling of vias/trenches, formation of plugs, etc.) 130 to establish electrical interconnections and external connections for the devices 116. In one embodiment, the devices 116 may be formed and interconnected to provide elements of a microprocessor, such as the elements of an MSP430 microprocessor available from Texas Instruments.

Instead of forming electrical connections for the pn junction of the photovoltaic cell through the n-type region 112 at the back side of the wafer 110, connections for the pn junction of device 100 are preferably established through the epitaxial layer 111 at the front side. This approach has the advantage that it leaves the entire back surface receptive to illumination. Otherwise, 10-20% of the available illuminated surface may be obstructed by contact formations. The illustrated contacts take the form of one or more deep silicon vias (DSVs). One of more via openings 136, 138 may be formed through the one or more pre-metal and/or other interlevel layers 128 from the front surface down to form electrical connection respectively to each of the n and p sides of the photovoltaic cell pn junction. A first via opening 136 extends through the epitaxial layer 111 down to the heavily doped n-type region 112, and a second via opening 138 extends through the epitaxial layer 111 down to the p-type bulk region of the substrate 110, to a position short of the n-type region 112. The first via opening 136 may, for example, be a single via of generally circular cross section having a diameter of, e.g., 80 to 100 microns. The second via opening 138 may, for example, likewise be a single via of generally circular cross section; however, having a diameter somewhat smaller than the diameter of the first via opening. The relative diameters of the first and second via openings 136, 138 may be chosen so that the two openings 136, 138 may be etched simultaneously using a common etchant, with the diameter differences of the openings set by, e.g., mask patterning (viz., patterned overlying photoresist or hardmask layer) establishing different vertical etch rates so the larger opening 136 extends down to the n-type region 112 and the smaller opening 138 terminates in the bulk p-type material. The etched openings 136, 138 may then be lined with a titanium nitride liner 142, followed by covering the liner 142 with a copper seed layer 144, and then filling the remainder of the opening with a copper fill metal 146. While fewer larger contacts may typically provide lower total contact resistance, the number of openings 136, 138 (viz., number of contacts to the pn junction) may be increased (or size decreased) to suit individual needs and preferences. Likewise, the locations of the openings 136, 138 (viz., locations of contacts to the pn junction) may be varied to suit individual needs and preferences.

In the shown arrangement, the openings 136, 138 are formed at locations peripheral to the locations of devices 116, so that they are located within a marginal border of a chip singulated from the wafer along first boundaries 152 determined by a first set of wafer scribe lines. A second set of wafer scribe lines may be provided to determine second boundaries 154 (shown in dot-and-dashed lines in FIG. 1) between the locations of filled openings 136, 138 and the locations of the devices 116. In general, the cost of fabricating the devices 116 will be greater than the cost of fabricating the photovoltaic cell pn junction. Providing the filled openings 136, 138 in the margins of the designated chip areas on the wafer between first and second sets of wafer scribe lines, offers the advantage that the photovoltaic cell contacts can be separated from the remainder of the chip including the integrated circuit elements (e.g., centrally located microprocessor elements) at the second boundaries 154 should, e.g., post-fabrication testing determine the photovoltaic cell portion to be unusable but the integrated circuit portion usable. In such case, the portion of the pn junction left between the boundaries 154 may provide additional diode protection (cathode defined by the n-type region 112, and anode defined by the bulk p-type material) for the remaining circuitry on a grounded substrate.

In an advantageous embodiment shown in FIG. 1, connections 156, 158 (shown schematically in FIG. 1) are formed together with the dielectric and metal layers of the interconnect structures 128, 130 between the top portions of the filled openings 136, 138 to establish electrical connection of the pn junction of the photovoltaic cell and the integrated circuit devices 116, so that voltage developed across the pn junction can serve as a power source for the devices 116. The device 100 is mounted within a package so that the back side is exposed to illumination. For example, the device 100 may be flipped and mounted in a sealed package with the integrated circuit devices 116 facing the inside bottom of a package cavity and with the anti-reflective coating 114 facing upwards and exposed to ambient light, e.g., either through a light transmissive window or through a light transmissive conformal flowing material deposited thereover and, e.g., cured in situ.

In operation, photons of light incident on the n-type region 112 through the light transmissive window or material will cause the development of a voltage across the pn junction between the contacts 136, 138 which may act as a primary or auxiliary power source for the devices 116 located on the same chip.

Figure 2A:
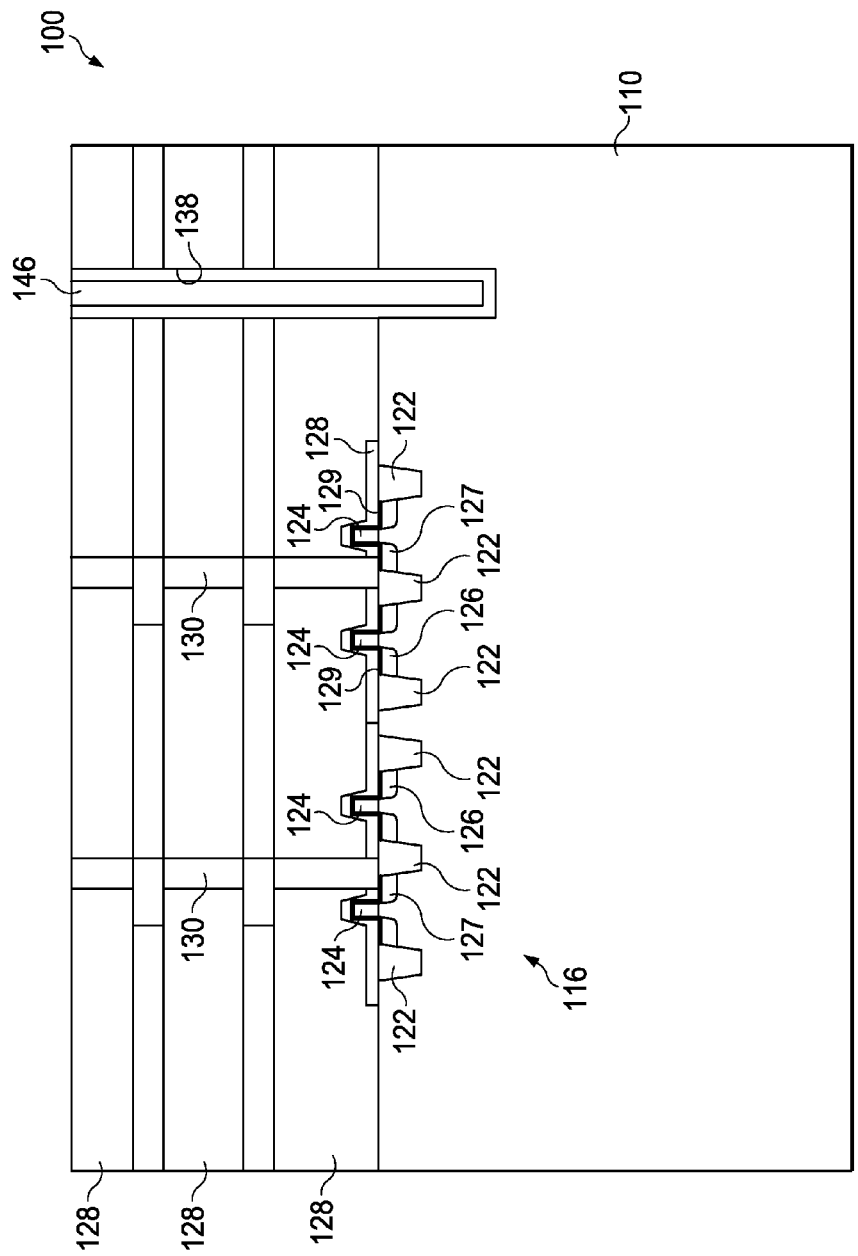
Figure 2C:
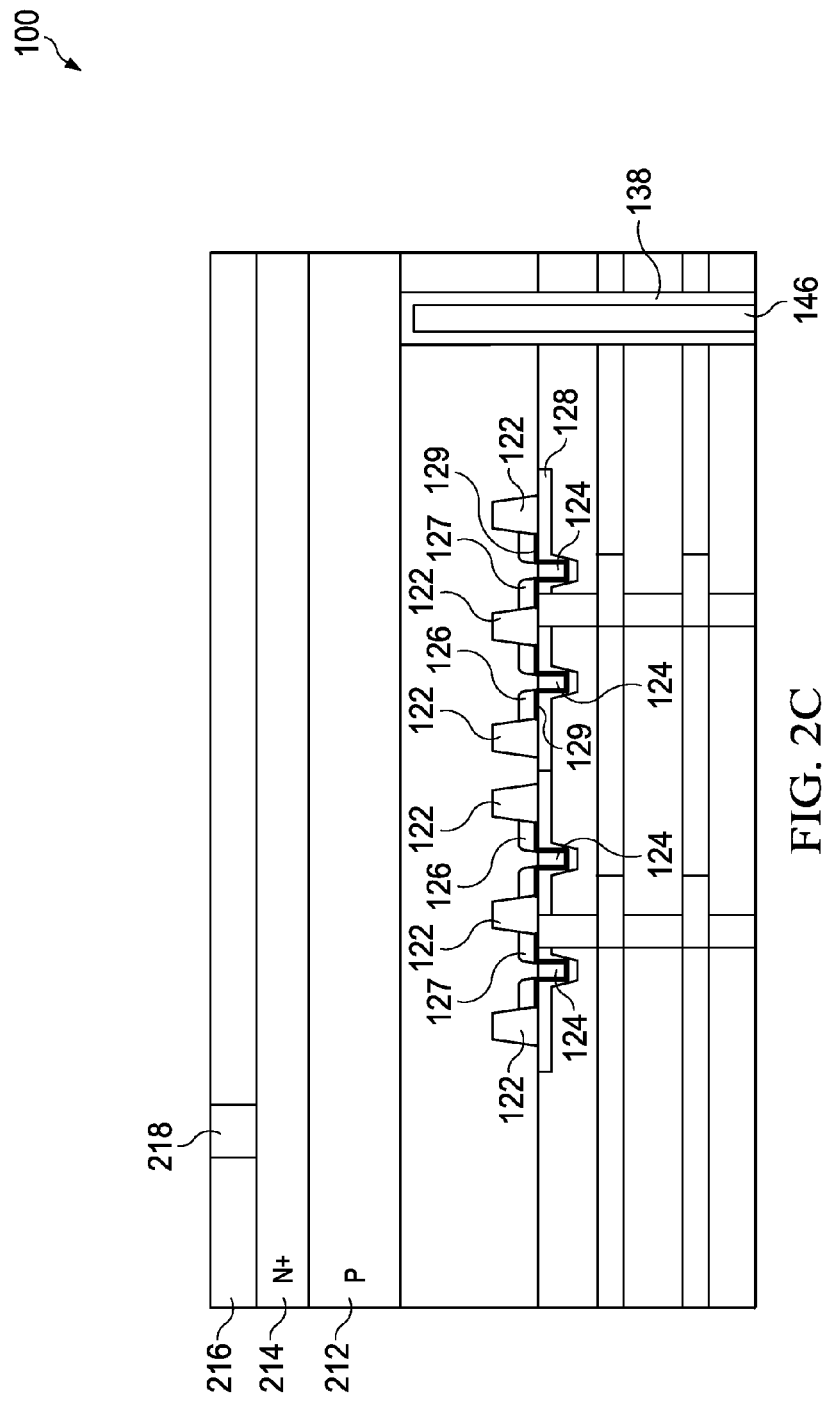

FIGS. 2A-2C illustrate a modified approach for fabricating the integrated photovoltaic cell and circuitry structure using a carrier wafer. In this approach, processing to form the circuit devices 116 discussed with reference to FIG. 1 precedes processing to form the pn junction of the photovoltaic cell.

FIG. 2A shows the formation of transistors and/or other circuit devices 116 in or on an upper portion of a semiconductor wafer 110 which may, e.g., be one or more isolated active areas defined in an upper region of a monocrystalline silicon wafer. The fabrication steps employed in the formation of the devices 116 may be similar to those described previously and may or may not involve the formation of an epitaxial layer such as epitaxial layer 111.

FIG. 2A shows an implementation with wells, isolation regions, source/drain regions and other implantations formed directly in the upper region of the silicon substrate without the addition of an epitaxial layer. As before, gate structures 124 are formed over the substrate 110 and one or more pre-metal, intrametal and/or interlevel dielectric layers 128 are formed over the gate structures 124 and source/drains 126, 127 together with the definition of metal interconnects (viz., etching and filling of vias/trenches, formation of plugs, etc.) 130 to establish electrical interconnections and external connections for the devices 116. One or more deep contacts, such as the through-silicon via (TSV), are also formed for establishing contact to the p-type region of the subsequently formed pn junction of the photovoltaic cell, described below. The deep contacts may, e.g., be established by forming successive aligned via openings 138 through the pre-metal, intrametal and/or interlevel dielectric layers 128 and into the material of the substrate 110, filling the same with conductive material 146 similar to the filling process previously described for the deep silicon vias (DSVs) described with reference to FIG. 1.

Following completion of the fabrication of the circuit devices 116 and contacts 130, 138/146, the wafer 110 shown in FIG. 2A may be inverted and bonded by its top surface to a corresponding top surface of a carrier wafer 210, as shown in FIG. 2B. This may be done, e.g., using a direct wafer bonding process such as a direct silicon bonding (DSB) process used in the manufacture of hybrid orientation technology (HOT) wafers for the optimization of crystal orientations in SOI structures. Once the wafer 110 is bonded to the carrier wafer 210, backgrinding, polishing and/or other techniques can be utilized to reduce the thickness of the back (now on top) of the wafer 110. The wafer 110 is shown in FIG. 2B after reducing the thickness of the substrate down to the level of the bottom of the through-silicon via (TSV) 138/146 (which may correspond to the depth of the deep silicon via (DSB) that connects to the p-type region of the pn junction shown in FIG. 1).

At this point, the reduced thickness wafer 110 may be further processed to add the photovoltaic cell. This is done by forming an n+n-type region over a p p-type region on the (inverted back side of) substrate 110. One approach to accomplish this is shown in FIG. 2C, wherein a first epitaxial layer 212 of p-type semiconductor material doped in situ (during deposition) is formed over the exposed surface of substrate 110 (viz., after backgrinding), and a second epitaxial layer 214 of n-type material doped in situ is then formed over the first epitaxial layer. Another approach is to form one or more undoped epitaxial layers and dope the n-type and p-type regions following deposition. Another approach is to leave a greater thickness of the inverted back side of substrate 110 remaining and form the doped regions within the already present material of the inverted wafer 110. For the latter approaches, laser annealing or similar localized annealing processes should be considered in order to limit thermal exposure of the completed circuitry 116 during any post-implantation dopant activation/diffusion steps. As shown in FIG. 2C, an anti-reflective coating 216, similar to layer 114 in FIG. 1, may be formed over the exposed surface of the n-type layer/region 214.

Electrical contact to the p-type layer/region 212 of the completed pn junction of the photovoltaic cell may be provided by the previously formed one or more through-silicon via (TSV) contacts 138/146. Electrical contact to the n-type layer/region 214 accessible at the inverted back side of substrate 110 may be provided through any form of contact 218, such as a metal-filled via formed through the anti-reflective coating 216 shown in FIG. 2C. Once the photovoltaic cell is completed, the carrier wafer (or any unneeded bulk portion thereof) can be removed.

Figure 3:
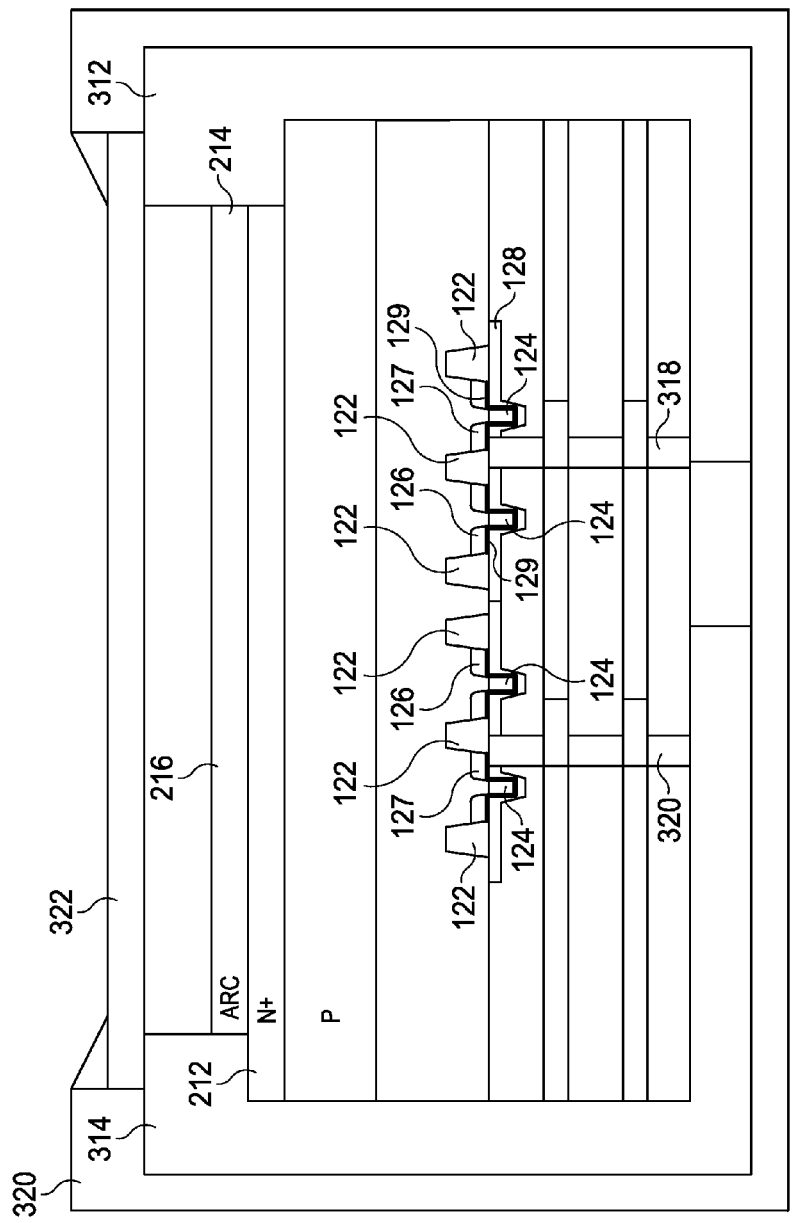
FIG. 3 is a simplified cross-sectional views of the integrated circuit device fabricated using a wraparound contact approach.

FIG. 3 illustrates an alternate contact routing approach for the structure shown in FIG. 2C. Here, instead of the contacts 138/146 and 218, wraparound contacts 312, 314 are used to establish electrical contact with the regions/layers 212, 214, respectively. Contacts 312, 314 may be integrated within a conductive shell forming part of a package that wraps around the otherwise completed integrated circuitry and photovoltaic cell, as shown. The parts of the shell that establish the contact for region/layer 212 are insulated from the parts that establish contact for region/layer 214, and from other portions of the integrated structure. This insulation may, e.g., be done by forming a liner of insulating material around the structure leaving contact openings in the liner prior to providing the wraparound pieces. The illustrated configuration shows the contacts 312, 314 respectively connected to different contacts 318, 320 to the circuitry 116.

Packaging for the integrated circuitry and photovoltaic cell may be a hermetically sealed package that includes a housing 320 enclosing the die structure and providing a window 322 positioned to allow ambient light from outside the housing to reach the region/layer 214 (through the anti-reflective coating 216) of the pn junction to enable functioning of the photovoltaic cell. Suitable packaging configurations may take forms similar to those used for packaging deformable micromirror devices (DMDs), light emitting diodes (LEDs), photosensors, and other optoelectronic devices.

The on-board photovoltaic cell may be used to self-power the on-board circuitry either as a sole power source or as a back-up or tandem source for a battery or other on-board or external power source. Embodiments of the integrated device offer especial advantage under circumstances where line power is unavailable and battery replacement is either not possible or not feasible. Typical applications include use as sensing elements for remote monitoring of environmental or other local conditions, such as use in a widely dispersed network of sensors for the remote and long duration monitoring of forest conditions to provide early detection and location of forest fires, or for detection of defects across the surface of the skin of an aircraft.

Those skilled in the art to which the invention relates will appreciate that other embodiments and variations of embodiments are possible within the scope of the claimed invention.

What is claimed is:

1. A method of forming an integrated circuit with a photovoltaic cell, comprising:
   forming PMOS and NMOS transistors in a front side of a semiconductor wafer;
   forming first and second contacts to the PMOS and NMOS transistors;
   forming first and second through-silicon vias (TSVs) into the semiconductor wafer;
   bonding the semiconductor wafer to a carrier wafer on the front side of the semiconductor wafer;
   thinning the semiconductor wafer from a backside to a bottom level of the first TSV;
   after thinning the semiconductor wafer, forming a photovoltaic cell on the backside of the semiconductor wafer, wherein the first TSV electrically and directly contacts the photovoltaic cell; and
   removing the carrier wafer from the semiconductor wafer.

2. The method of claim 1, further comprising
   forming respective electrical interconnects from the first and second TSVs to the first and second contacts of the PMOS and NMOS transistors, wherein the photovoltaic cell is electrically connected to at least one of the PMOS and NMOS transistors through the first TSV.

3. The method of claim 2, wherein forming the photovoltaic cell comprises the step of forming a first doped region of a first conductivity type on a second doped region of a second, opposite, conductivity type at the backside of the semiconductor wafer to form a pn junction of the photovoltaic cell.

4. The method of claim 3, wherein forming the first doped region of the pn junction comprises counterdoping the backside of the semiconductor wafer, with the second doped region of the pn junction being at least partially defined by a non-counterdoped region of the semiconductor wafer.

5. The method of claim 3, wherein forming the second doped region comprises forming a first epitaxial layer on the backside of the semiconductor wafer and forming the first doped region comprises forming a second epitaxial layer on the first epitaxial layer.

6. The method of claim 3, wherein the front side of the semiconductor wafer includes an epitaxial layer of semiconductor material formed in an upper region; and well regions and source/drain regions are formed in the epitaxial layer.

7. The method of claim 3, further comprising forming an antireflective layer in direct contact with the first doped region.

8. A method of forming an integrated circuit with a photovoltaic cell, comprising:
   forming PMOS and NMOS transistors in a front side of a semiconductor wafer;
   forming first and second contacts to the PMOS and NMOS transistors;
   forming first and second through-silicon vias (TSVs) into the semiconductor wafer, wherein the first TSV is deeper and wider than the second TSV;
   forming an n-type layer on a p-type layer at the backside of the semiconductor wafer to form a photovoltaic cell, wherein the first TSV electrically contacts the n-type layer of the photovoltaic cell and the second TSV electrically contacts the p-type layer of the photovoltaic cell; and
   connecting the first TSV to the first contact and the second TSV to the second contact on the front side of the semiconductor wafer.

9. The method of claim 8, wherein forming the n-type layer comprises counterdoping the backside of the semiconductor wafer, with the p-type layer being at least partially defined by a non-counterdoped region of the semiconductor wafer.

10. The method of claim 8, wherein the p-type layer comprises a first epitaxial layer on the backside of the semiconductor wafer and the n-type layer comprises a second epitaxial layer formed on the first epitaxial layer.

11. The method of claim 8, wherein the front side of the semiconductor wafer includes an epitaxial layer of semiconductor material formed in an upper region;
   and well regions and source/drain regions are formed in the epitaxial layer.

12. The method of claim 8, further comprising forming an antireflective layer in direct contact with the n-type layer.

* * * * *